(12) United States Patent
Kurokawa et al.

(10) Patent No.: US 7,965,340 B2
(45) Date of Patent: Jun. 21, 2011

(54) LIQUID CRYSTAL DISPLAY APPARATUS

(75) Inventors: Kazumasa Kurokawa, Kariya (JP); Yoshimi Kondo, Anjo (JP); Hirokazu Shibata, Okazaki (JP)

(73) Assignee: Denso Corporation, Kariya (JP)

( * ) Notice: Subject to any disclaimer, the term of this patent is extended or adjusted under 35 U.S.C. 154(b) by 210 days.

(21) Appl. No.: 11/518,904

(22) Filed: Sep. 12, 2006

(65) Prior Publication Data

US 2007/0058103 A1    Mar. 15, 2007

(30) Foreign Application Priority Data

Sep. 12, 2005  (JP) ................................. 2005-264282

(51) Int. Cl.
*H04N 9/74* (2006.01)

(52) U.S. Cl. .......................................... 348/580; 349/38

(58) Field of Classification Search ................ 349/19.33, 349/56, 84, 139, 19, 33; 348/580; 361/687
See application file for complete search history.

(56) References Cited

U.S. PATENT DOCUMENTS

| | | | |
|---|---|---|---|
| 2,760,122 A * | 8/1956 | Harris ............................ 361/727 |
| 2,944,404 A * | 7/1960 | Fritts ................................. 62/3.4 |
| 2,959,715 A * | 11/1960 | Leonchick ..................... 361/829 |
| 3,155,767 A * | 11/1964 | Schellack ....................... 174/260 |
| 3,445,669 A * | 5/1969 | Erickson et al. ............... 250/577 |
| 3,566,190 A * | 2/1971 | Huebner et al. ............... 361/690 |
| 3,590,508 A * | 7/1971 | Jones et al. ...................... 40/573 |
| 3,782,360 A * | 1/1974 | Brucken ...................... 126/19 R |
| 3,828,215 A * | 8/1974 | Bilsback .......................... 313/50 |
| 4,084,213 A * | 4/1978 | Kirchner et al. ............... 361/680 |
| 4,319,302 A * | 3/1982 | Moulden ........................ 361/213 |
| 4,447,856 A * | 5/1984 | Takahashi et al. ............. 361/692 |
| 4,466,049 A * | 8/1984 | Chaney et al. ................. 361/691 |
| 4,498,717 A * | 2/1985 | Reimer ............................ 439/61 |
| 4,532,576 A * | 7/1985 | Reimer .......................... 361/797 |
| 4,536,824 A * | 8/1985 | Barrett et al. .................. 361/694 |
| 4,587,593 A * | 5/1986 | Liautaud et al. ............... 361/690 |
| 4,716,499 A * | 12/1987 | Bhargava ....................... 361/740 |
| 4,930,045 A * | 5/1990 | Carlson et al. ................ 361/329 |
| 4,956,750 A * | 9/1990 | Maggelet ....................... 361/807 |
| 4,980,848 A * | 12/1990 | Griffin et al. .................. 361/687 |
| 5,008,582 A * | 4/1991 | Tanuma et al. ................ 310/332 |
| 5,018,050 A * | 5/1991 | Maenishi et al. .............. 361/717 |
| 5,074,116 A * | 12/1991 | Kadotani et al. ................ 62/3.2 |

(Continued)

FOREIGN PATENT DOCUMENTS

DE    202004015168 U1 *  1/2005

(Continued)

*Primary Examiner* — Brian M. Healy
*Assistant Examiner* — Peter Radkowski
(74) *Attorney, Agent, or Firm* — Nixon & Vanderhye P.C.

(57) ABSTRACT

A LCD apparatus includes a liquid crystal panel, a circuit board having a mounting surface and circuit elements mounted on the mounting surface to constitute a drive circuit for driving the LCD apparatus, and a case for holding the liquid crystal panel and the circuit board. The circuit board is positioned approximately in a vertical direction during normal use of the LCD apparatus. The circuit elements include a first element having a first projecting length from the mounting surface and a second element having a second projecting length from the mounting surface. The first projecting length is greater than a projecting length of any other element of the circuit elements. The second projecting length is slightly smaller than the first projecting length. The first and the second elements are arranged on the mounting surface approximately in a line in the vertical direction.

12 Claims, 5 Drawing Sheets

U.S. PATENT DOCUMENTS

| | | | | |
|---|---|---|---|---|
| 5,103,374 A * | 4/1992 | Azar | | 361/689 |
| 5,136,465 A * | 8/1992 | Benck et al. | | 361/687 |
| 5,164,737 A * | 11/1992 | Murray et al. | | 343/702 |
| 5,173,819 A * | 12/1992 | Takahashi et al. | | 360/97.03 |
| 5,276,584 A * | 1/1994 | Collins et al. | | 361/718 |
| 5,313,362 A * | 5/1994 | Hatada et al. | | 361/709 |
| 5,478,221 A * | 12/1995 | Loya | | 417/313 |
| 5,583,529 A * | 12/1996 | Satou | | 345/87 |
| 5,621,613 A * | 4/1997 | Haley et al. | | 361/687 |
| 5,632,918 A * | 5/1997 | Zook et al. | | 219/420 |
| 5,634,351 A * | 6/1997 | Larson et al. | | 62/259.2 |
| 5,656,847 A * | 8/1997 | Okazaki et al. | | 257/433 |
| 5,661,637 A * | 8/1997 | Villaume | | 361/679.47 |
| 5,671,120 A * | 9/1997 | Kikinisi | | 361/687 |
| 5,689,400 A * | 11/1997 | Ohgami et al. | | 361/683 |
| 5,690,114 A * | 11/1997 | Chiang et al. | | 600/447 |
| 5,699,609 A * | 12/1997 | Wieloch | | 29/830 |
| 5,703,753 A * | 12/1997 | Mok | | 361/715 |
| 5,751,553 A * | 5/1998 | Clayton | | 361/749 |
| 5,764,483 A * | 6/1998 | Ohashi et al. | | 361/699 |
| 5,774,333 A * | 6/1998 | Janik et al. | | 361/687 |
| 5,912,800 A * | 6/1999 | Sammakia et al. | | 361/690 |
| 5,930,112 A * | 7/1999 | Babinski et al. | | 361/695 |
| 5,966,286 A * | 10/1999 | O'Connor et al. | | 361/699 |
| 6,022,196 A * | 2/2000 | Jensen et al. | | 417/44.1 |
| 6,043,979 A * | 3/2000 | Shim | | 361/695 |
| 6,115,251 A * | 9/2000 | Patel et al. | | 361/699 |
| 6,173,759 B1 * | 1/2001 | Galyon et al. | | 165/80.4 |
| 6,212,069 B1 * | 4/2001 | Janik et al. | | 361/687 |
| 6,243,261 B1 * | 6/2001 | Janik et al. | | 361/687 |
| 6,285,100 B1 * | 9/2001 | Pflueger et al. | | 310/68 D |
| 6,297,956 B1 * | 10/2001 | Janik et al. | | 361/687 |
| 6,318,102 B1 * | 11/2001 | Asou et al. | | 62/244 |
| 6,353,529 B1 * | 3/2002 | Cies | | 361/679.05 |
| 6,359,782 B1 * | 3/2002 | Scofield | | 361/689 |
| 6,377,468 B1 * | 4/2002 | Ohtani et al. | | 361/783 |
| 6,494,429 B2 * | 12/2002 | Tajima | | 248/473 |
| 6,515,858 B2 * | 2/2003 | Rodriguez et al. | | 361/695 |
| 6,541,942 B1 * | 4/2003 | Francis | | 320/166 |
| 6,577,502 B1 * | 6/2003 | DiStefano et al. | | 361/687 |
| 6,587,336 B2 * | 7/2003 | Chu et al. | | 361/679.47 |
| 6,595,269 B2 * | 7/2003 | Mitchell | | 165/86 |
| 6,657,861 B2 * | 12/2003 | Irmer | | 361/695 |
| 6,674,642 B1 * | 1/2004 | Chu et al. | | 361/679.27 |
| 6,728,092 B2 * | 4/2004 | Hunt et al. | | 361/303 |
| 6,825,894 B2 * | 11/2004 | Aoyagi et al. | | 349/61 |
| 6,833,992 B2 * | 12/2004 | Kusaka et al. | | 361/699 |
| 6,867,985 B2 * | 3/2005 | Westerinen et al. | | 361/818 |
| 6,920,046 B2 * | 7/2005 | Spryshak | | 361/704 |
| 6,958,906 B2 * | 10/2005 | Wu et al. | | 361/679.5 |
| 7,012,814 B2 * | 3/2006 | Sugimoto et al. | | 361/803 |
| 7,031,155 B2 * | 4/2006 | Sauciuc et al. | | 361/695 |
| 7,042,724 B2 * | 5/2006 | L cker | | 361/699 |
| 7,095,180 B2 * | 8/2006 | Emslie et al. | | 315/161 |
| 7,116,552 B2 * | 10/2006 | Wu | | 361/679.26 |
| 7,133,281 B2 * | 11/2006 | Bae | | 361/681 |
| 7,214,887 B2 * | 5/2007 | Higashida et al. | | 174/260 |
| 7,230,316 B2 * | 6/2007 | Yamazaki et al. | | 257/531 |
| 7,269,009 B2 * | 9/2007 | Ryu et al. | | 361/692 |
| 7,292,290 B2 * | 11/2007 | Miyagawa et al. | | 349/58 |
| 7,349,223 B2 * | 3/2008 | Haemer et al. | | 361/767 |
| 7,383,629 B2 * | 6/2008 | Lauffer et al. | | 29/846 |
| 2002/0064027 A1 * | 5/2002 | Sasaki et al. | | 361/700 |
| 2002/0067441 A1 * | 6/2002 | Nakashima et al. | | 349/38 |
| 2002/0109969 A1 * | 8/2002 | Wellhofer | | 361/687 |
| 2003/0011983 A1 * | 1/2003 | Chu et al. | | 361/687 |
| 2004/0001310 A1 * | 1/2004 | Chu et al. | | 361/687 |
| 2004/0070943 A1 * | 4/2004 | Chrysler et al. | | 361/703 |
| 2004/0201957 A1 * | 10/2004 | Wu et al. | | 361/687 |
| 2004/0231878 A1 * | 11/2004 | Higashida et al. | | 174/52.4 |
| 2004/0233663 A1 * | 11/2004 | Emslie et al. | | 362/221 |
| 2004/0264141 A1 * | 12/2004 | Spryshak | | 361/719 |
| 2005/0068261 A1 * | 3/2005 | Oh | | 345/60 |
| 2005/0286008 A1 * | 12/2005 | Miyagawa et al. | | 349/158 |
| 2006/0284574 A1 * | 12/2006 | Emslie et al. | | 315/312 |
| 2007/0048561 A1 * | 3/2007 | Aiello et al. | | 429/13 |
| 2007/0048574 A1 * | 3/2007 | Aiello et al. | | 429/26 |
| 2007/0103101 A1 * | 5/2007 | Kikuchi et al. | | 318/140 |
| 2007/0180264 A1 * | 8/2007 | Ni et al. | | 713/186 |
| 2007/0183209 A1 * | 8/2007 | Ni et al. | | 365/185.22 |
| 2008/0146051 A1 * | 6/2008 | Honda | | 439/66 |

FOREIGN PATENT DOCUMENTS

| | | | |
|---|---|---|---|
| DE | 202004015169 U1 * | 1/2005 | |
| JP | 11-38384 | 2/1999 | |
| JP | 11053061 A * | 2/1999 | |
| JP | 2000151031 A * | 5/2000 | |
| JP | 2000261176 A * | 9/2000 | |
| JP | 2004-279262 | 10/2004 | |
| JP | 2007195292 A * | 8/2007 | |

* cited by examiner

LIQUID CRYSTAL DISPLAY APPARATUS

CROSS REFERENCE TO RELATED APPLICATION

This application is based on and incorporates herein by reference Japanese Patent Application No. 2005-264282 filed on Sep. 12, 2005.

FIELD OF THE INVENTION

The present invention relates to a liquid crystal display apparatus.

BACKGROUND OF THE INVENTION

A conventional liquid crystal display (LCD) apparatus, for example, disclosed in JP-H11-38384A, includes a liquid crystal panel, a backlight for illuminating the liquid crystal panel, a circuit board having an electrical circuit for driving the liquid crystal panel. The liquid crystal panel, the backlight, and the circuit board are stacked in that order and housed in a case.

In such a conventional LCD apparatus, a heater heats the liquid crystal panel to its desired operating temperature, thereby increasing the speed of response of the liquid crystal panel. The circuit board includes many circuit elements such as a transistor, diode, and the like. Some of these circuit elements (e.g., a power control element for controlling the backlight) generate heat. Therefore, temperature of the conventional LCD apparatus is higher than ambient temperature during its operation.

Some of these circuit elements (e.g., a central processing unit (CPU) for controlling the liquid crystal panel) have a relatively low maximum operating temperature. The circuit elements having the relatively low maximum operating temperatures need to be maintained below the respective maximum operating temperatures during the operation of the conventional LCD apparatus.

The conventional LCD apparatus is mounted to a vehicle such that the liquid crystal panel faces horizontally toward a driver. Therefore, the conventional LCD apparatus is approximately vertically mounted to the vehicle, and accordingly the circuit board is approximately vertically positioned during normal use of the conventional LCD apparatus.

Since the temperature of the conventional LCD apparatus is higher than the ambient temperature during its operation, air flows upward inside the conventional LCD apparatus due to natural convection. The upward flow of air cools the circuit elements mounted on the circuit board.

Some of the circuit elements, for example, a capacitor, are relatively tall. In other words, a distance from a mounting surface of the circuit board to a top surface of some of the circuit elements is relatively long. The number of the tall circuit elements is large and the tall circuit elements obstruct the upward flow of air.

FIG. 7 shows a circuit board 200 as an example of the circuit board of the conventional LCD apparatus. Capacitors 9, 10, a central processing unit (CPU) 11, and electronic elements 12 are mounted on the circuit board 200. FIG. 8 shows the circuit board 200 viewed from a vertical direction indicated by an arrow VIII of FIG. 7. As can be seen from FIG. 8, the capacitors 9, 10 are relatively tall. The conventional LCD apparatus is mounted to the vehicle in the vertical direction, and accordingly the circuit board 200 is positioned in the vertical direction during normal use of the conventional LCD apparatus.

As shown in FIG. 7, the capacitors 9, 10 as the tall circuit elements are arranged all over the circuit board 200 because the capacitors 9, 10 are arranged only in terms of their function as an electrical circuit. As shown in FIG. 8, therefore, there is very little space area along the mounting surface of the circuit board 200. As a result, the amount of the upward flow of air is reduced and the circuit elements mounted on the circuit board 200 cannot be maintained below the maximum operating temperature during the operation of the conventional LCD apparatus.

Increasing a distance between the case and the capacitors 9, 10 may produce the upward flow of air enough to cool the circuits elements mounted on the circuit board 200. However, recently, there has been an increase in demand for a LCD apparatus having reduced size, in particular, reduced thickness. Therefore, it is difficult to increase the distance between the case and the capacitors 9, 10.

SUMMARY OF THE INVENTION

In view of the above-described problem, it is an object of the present invention to provide a liquid crystal display apparatus in which adequate airflow can be provided without increasing size of the liquid crystal display apparatus.

A liquid crystal display apparatus includes a liquid crystal panel, a circuit board having a mounting surface and a plurality of circuit elements that are mounted on the mounting surface to constitute a drive circuit for driving the liquid crystal display apparatus, and a case for holding the liquid crystal panel and the circuit board. The circuit board is positioned approximately in a vertical direction during normal use of the liquid crystal display apparatus. The circuit elements include a first element having a first projecting length from the mounting surface and a second element having a second projecting length from the mounting surface. The first projecting length is greater than a projecting length of any other element of the circuit elements. The second projecting length is slightly smaller than the first projecting length. The first and the second elements are arranged on the mounting surface approximately in a line in the vertical direction.

A direction of airflow caused by natural convection due to heat generated by the liquid crystal display apparatus is the same as the vertical direction. Since the first and the second elements having the long projecting length are arranged on the mounting surface approximately in the line in the vertical direction, the airflow easily flows along the mounting surface of the circuit board. Thus, the circuit elements mounted on the mounting surface of the circuit board can be adequately cooled by the airflow without increasing size of the liquid crystal display apparatus.

BRIEF DESCRIPTION OF THE DRAWINGS

The above and other objectives, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
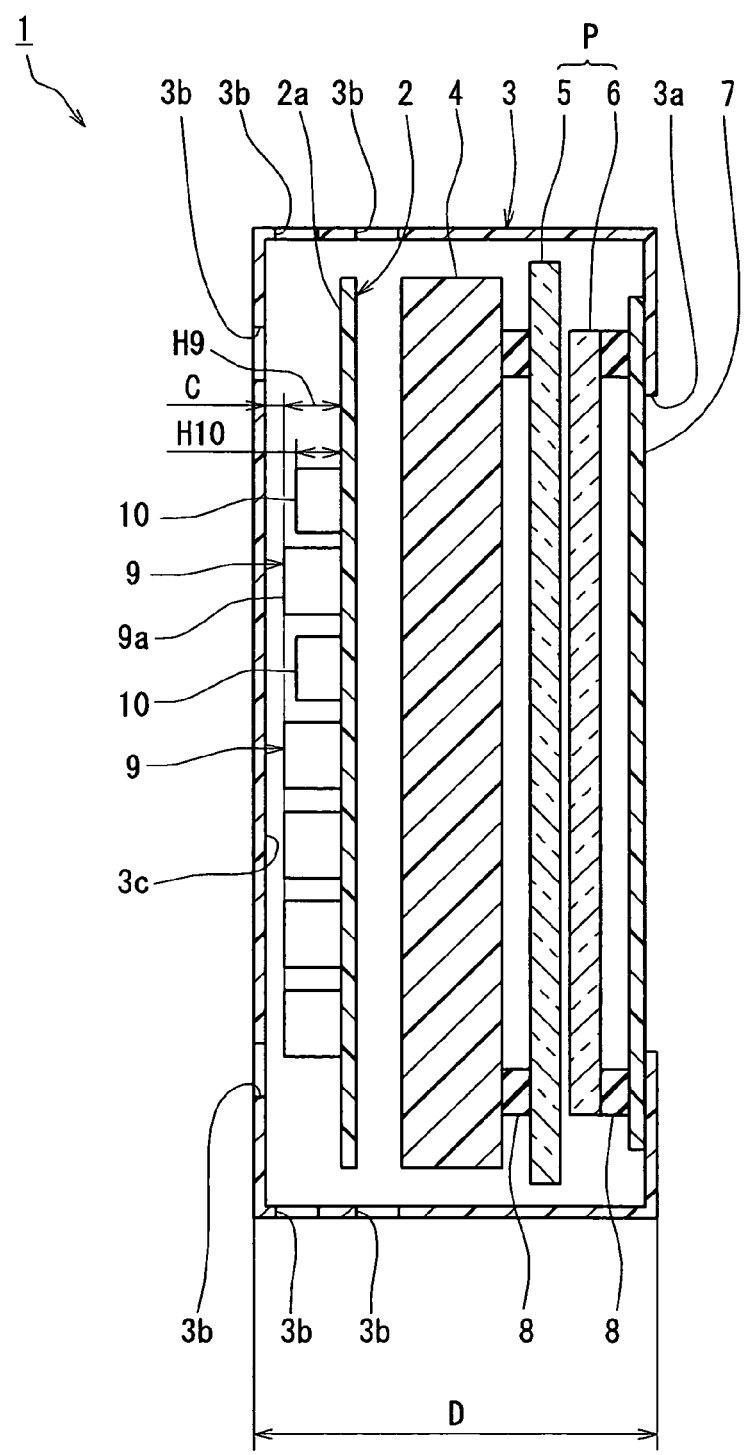
FIG. 1 is a cross-sectional view of a LCD apparatus according to a first embodiment of the present invention.

Referring to FIG. 1, a matrix type liquid crystal display (LCD) apparatus 1 includes a liquid crystal panel P, a printed circuit board 2, a case 3 with an opening 3a and vent holes 3b, and a backlight 4 for illuminating the liquid crystal panel P. The liquid crystal panel P, the printed circuit board 2, and the backlight 4 are housed in the case 3. The LCD apparatus 1 is approximately vertically mounted to a vehicle such that the liquid crystal panel P faces horizontally toward a driver. Accordingly, the circuit board 2 is approximately vertically positioned during normal use of the LCD apparatus 1.

The liquid crystal panel P has electrode substrates 5, 6 between which antiferroelectric liquid crystals are injected. Polarizing films are attached to the outside of each of the electrode substrates 5, 6. The electrode substrate 5 is constructed such that a color filter, transparent electrodes arranged in lines, and a rubbed film are stacked on one surface of a transparent substrate in that order. The electrode substrate 6 is constructed such that transparent electrodes arranged in lines and a rubbed film are stacked on one surface of a transparent substrate in that order.

The electrode substrates 5, 6 are joined together such that each of the transparent electrodes of the electrode substrate 5 is arranged perpendicular to each of the transparent electrodes of the electrode substrate 6. Thus, a matrix of pixel electrodes are provided. The transparent electrodes of the electrode substrate 5 correspond to data electrodes and the transparent electrodes of the electrode substrate 6 correspond to scanning electrodes.

As shown in FIG. 1, the liquid crystal panel P is fixed to the case 3 in such a manner that the outer edge portion (i.e., outside of display area) of the electrode substrate 6 is attached to the opening 3a of the case 3 through a transparent plate 7 and circular heat insulators 8. The backlight 4 is attached to the outer edge portion (i.e., outside of the display area) of the electrode substrate 5 through the heat insulators 8. Light emitted from the backlight 4 passes through the liquid crystal panel P and the transparent plate 7, and exits the case 3 through the opening 3a.

The printed circuit board 2 is placed behind the backlight 4 and fixed to an inner wall of the case 3. The printed circuit board 2 includes circuits for driving the liquid crystal panel P and the backlight 4.

For example, the case 3 is manufactured by metal pressing or resin molding. The vent holes 3b allow air to circulate between the inside and the outside of the case 3 so that heat generated by the LCD apparatus 1 can escape to the outside of the case 3.

Figure 4:
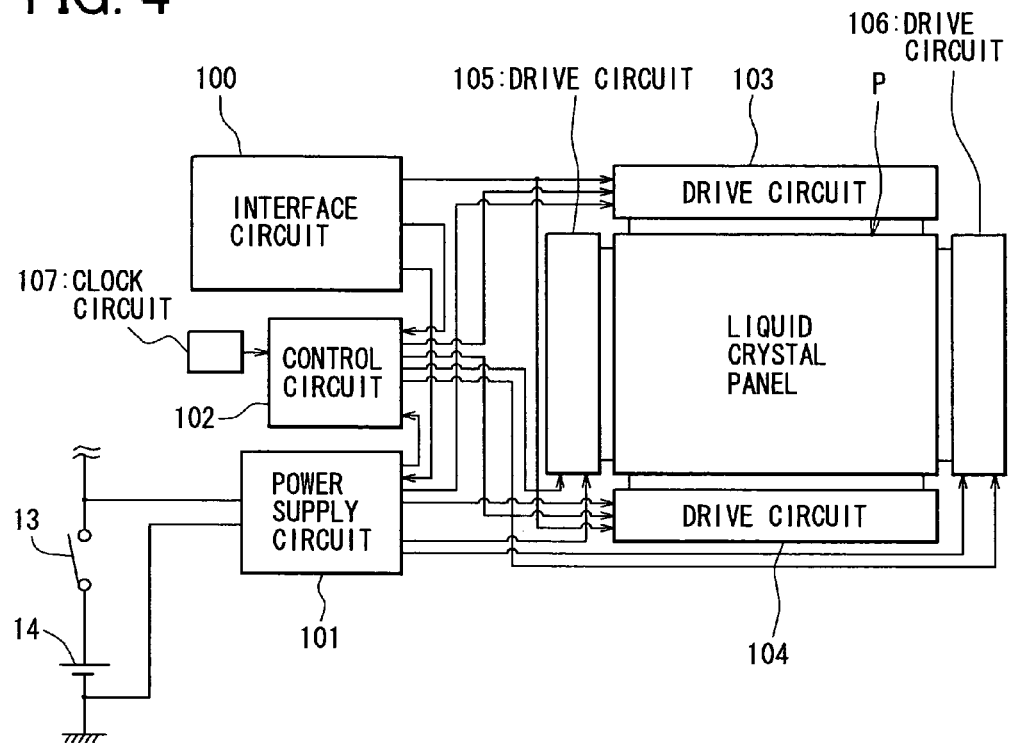
FIG. 4 is an electrical configuration of the LCD apparatus of FIG. 1.

An electrical configuration of the LCD apparatus 1 is described with reference to FIG. 4. As shown in FIG. 4, the LCD apparatus 1 includes an interface circuit 100, a power supply circuit 101, a control circuit 102, data electrode drive circuits 103, 104, scanning electrode drive circuits 105, 106, and a clock circuit 107. The printed circuit board 2 implements these circuits.

The power supply circuit 101 is connected to a battery 14 through an ignition switch 13. When the ignition switch 13 is turned on, the LCD apparatus 1 starts its operation. The battery 14 supplies electric power (e.g., 12 VDC) to the power supply circuit 101. The power supply circuit 101 generates several different DC reference voltages by means of, for example, a DC-DC converter and supplies the DC reference voltages to the control circuit 102, the data electrode drive circuits 103, 104, and the scanning electrode drive circuits 105, 106.

The interface circuit 100 outputs a RGB signal to each of the data electrode drive circuits 103, 104 and outputs each of a vertical synchronizing signal and a horizontal synchronizing signal to the control circuit 102.

The control circuit 102 outputs a drive signal to each of the data electrode drive circuits 103, 104 and the scanning electrode drive circuits 105, 106 based on the vertical synchronizing signal, the horizontal synchronizing signal and a clock signal input from the clock circuit 107.

Each of the data electrode drive circuits 103, 104 has multiple shift register circuits controlled by the control circuit 102, a data latch circuit for latching outputs from the shift register circuits, multiple decoder circuits for decoding outputs from the data latch, and multiple analog switches controlled by the power supply circuit 101. The number of the decoders is equal to that of the data electrodes. Likewise, the number of the analog switches is equal to that of the data electrodes.

Each of the scanning electrode drive circuits 105, 106 has multiple shift register circuits controlled by the control circuit 102, a data latch circuit for latching outputs from the shift register circuits, multiple decoder circuits for decoding outputs from the data latch, and multiple analog switches controlled by the power supply circuit 101. The number of the decoders is equal to that of the scanning electrodes. Likewise, the number of the analog switches is equal to that of the scanning electrodes.

Each of the scanning electrode drive circuits 105, 106 is controlled by the control circuit 102 and each of the data electrode drive circuits 103, 104 receives the outputs from the interface circuit 100. Thus, the data electrode drive circuits 103, 104 and the scanning electrode drive circuits 105, 106 cause the liquid crystal panel P to work as an active matrix panel.

The printed circuit board 2 includes various types of circuit elements that constitute the circuits shown in FIG. 4. For example, the printed circuit board 2 includes capacitors 9, 10, a central processing unit (CPU) 11, and electronic elements 12. The printed circuit board 2 further includes chip resistors, chip capacitors, chip transistors, chip diodes, and the like.

Figure 2:
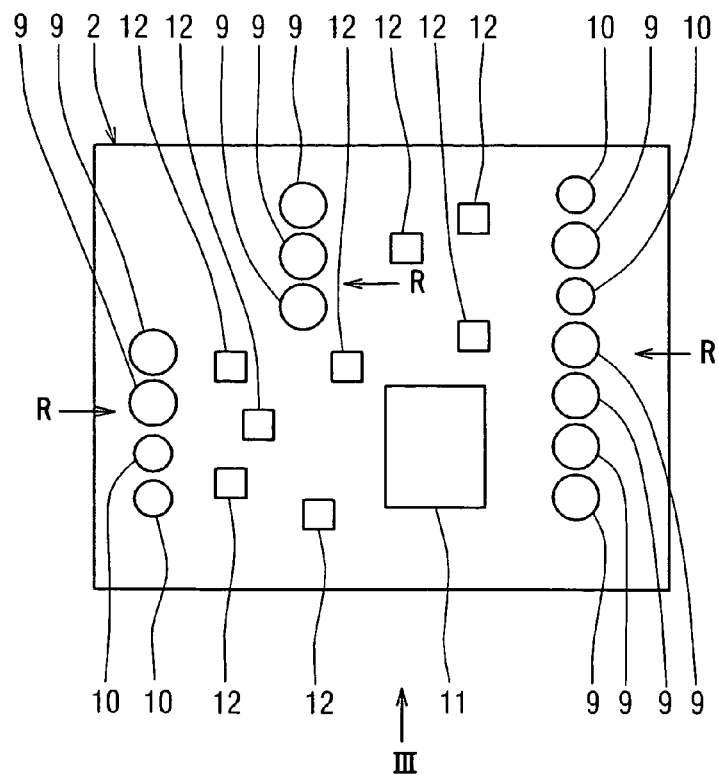
FIG. 2 is a top view of a circuit board of the LCD apparatus of FIG. 1.

As descried above, the LCD apparatus 1 is mounted to the vehicle approximately in the vertical direction. In FIG. 2, the arrow III indicates the vertical direction.

The capacitors 9 have a cylindrical shape and a projecting length (i.e., height) H9 from a mounting surface 2a of the printed circuit board 2. The projecting length H9 of the capacitors 9 is greater than that of any other circuit element mounted on the printed circuit board 2.

The capacitors 10 have a cylindrical shape and a projecting length H10 from a mounting surface 2a of the printed circuit board 2. The projecting length H10 of the capacitors 10 is slightly smaller than the projecting length H9 of the capacitors 9.

The CPU 11 includes a microcomputer and implements the control circuit 102.

The electronic elements 12 include an electric power control integrated circuit (IC) and implement the power supply circuit 101 and a backlight control circuit (not shown) for controlling illumination of the backlight 4.

Figure 3:
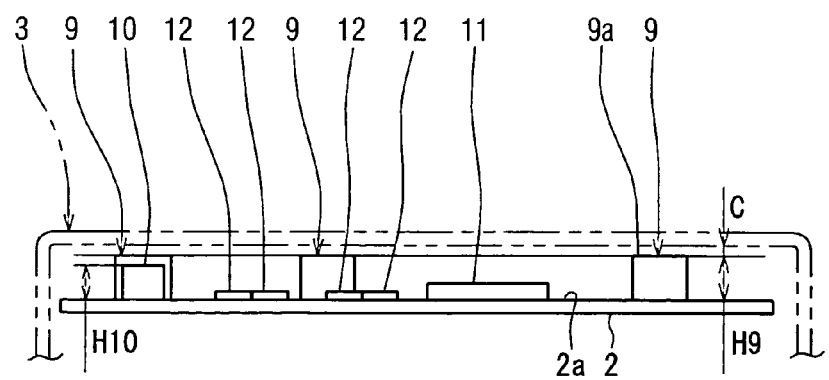
FIG. 3 is a side view of the circuit board of FIG. 2 viewed from a direction indicated by an arrow III of FIG. 2.

The capacitors 9, 10 are arranged in three lines in the vertical direction, as indicated by arrows R of FIG. 2. As shown in FIG. 3, therefore, the capacitors 9, 10 overlap each other in each line when viewed from the vertical direction.

The LCD apparatus 1 is mounted to the vehicle such that the capacitors 9, 10 overlap each other in each line in the vertical direction. A direction of airflow caused by natural convection due to heat generated by the LCD apparatus 1 is the same as the vertical direction. Thus, airflow area is adequately provided so that the amount of airflow along the mounting surface 2a of the printed circuit board 2 can be adequately increased. The increased airflow effectively cools the circuit elements mounted on the printed circuit board 2 so that temperature of the circuit elements (e.g., CPU 11) having a relatively low maximum operating temperature can be maintained below the maximum operating temperature.

A shortest distance C between the printed circuit board 2 and the case 3 is the distance between a top surface 9a of the capacitors 9 and an inner surface 3c of the case 3. The printed circuit board 2 is fixed inside the case 3 such that the shortest distance C is 1 millimeter (mm).

Figure 5:
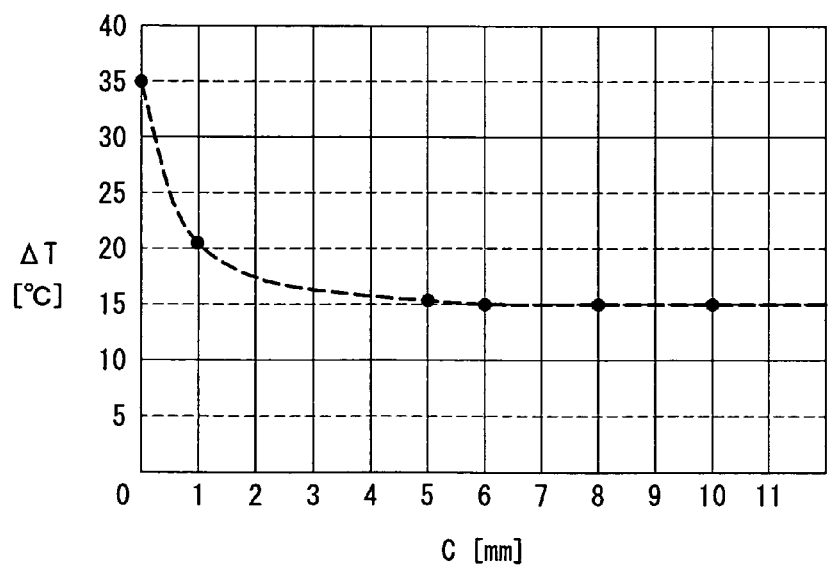
FIG. 5 is a graph showing a relationship between a distance and a temperature increase of a circuit element mounted on the circuit board of FIG. 2.

The shortest distance C is set to 1 mm for the following reason: FIG. 5 is a graph illustrating a relationship between a temperature increase $\Delta T$ and the shortest distance C. The temperature increase $\Delta T$ represents an increase in temperature of the circuit elements mounted on the printed circuit board 2 with respect to the ambient temperature.

As can be seen from the graph, when the shortest distance C is 0 mm, i.e., when the capacitors 9 come into contact with the case 3, the temperature increase $\Delta T$ is 35 degrees Celsius (° C.). The temperature increase $\Delta T$ gradually decreases with an increase in the shortest distance C in a range of the shortest distance C from 0 mm to 5 mm. The temperature increase $\Delta T$ is about 20° C. at the shortest distance C of 1 mm and about 15° C. at the shortest distance C of 5 mm. The temperature increase $\Delta T$ is constant at 15° C., even when the shortest distance C is increased above 5 mm.

The CPU 11 generally has a maximum operating temperature of 85° C. and the maximum ambient temperature in the vehicle is generally about 65° C. Therefore, the temperature of the CPU 11 can be maintained below 85° C. by setting the shortest distance C to 1 mm when the LCD apparatus 1 is used in the vehicle.

Thus, the temperatures of the circuit elements mounted on the printed circuit board 2 can be maintained below the respective maximum operating temperatures without increasing a thickness D of the LCD apparatus 1.

Second Embodiment

Figure 6:
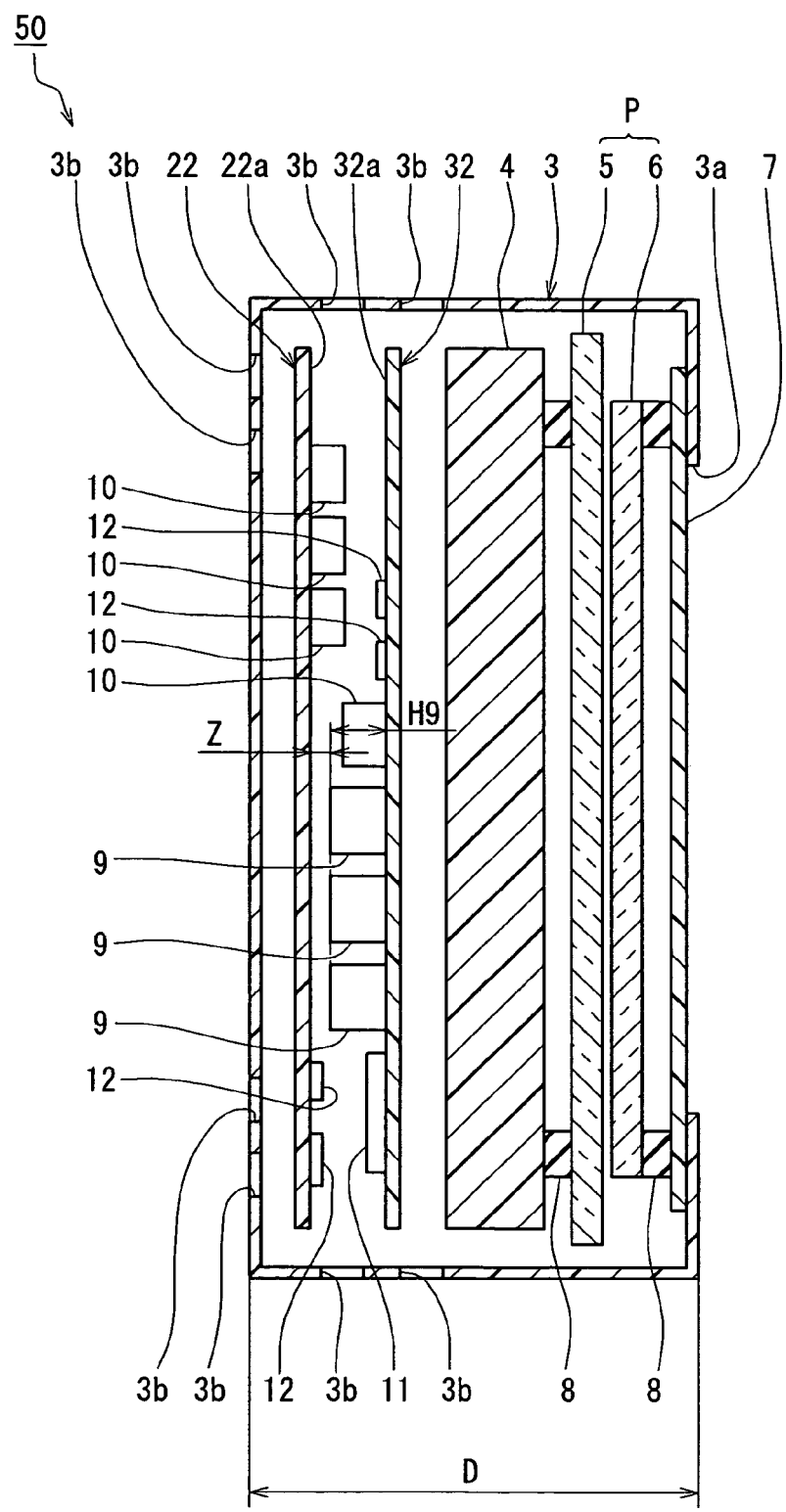
FIG. 6 is a cross-sectional view of a LCD apparatus according to a second embodiment of the present invention.
Figure 7:
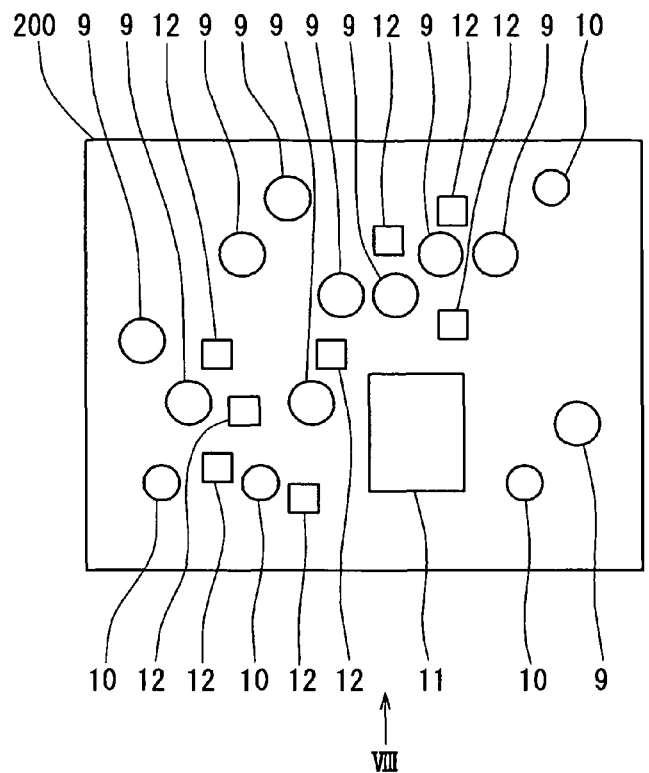
FIG. 7 is a top view of a circuit board of a conventional LCD apparatus.
Figure 8:
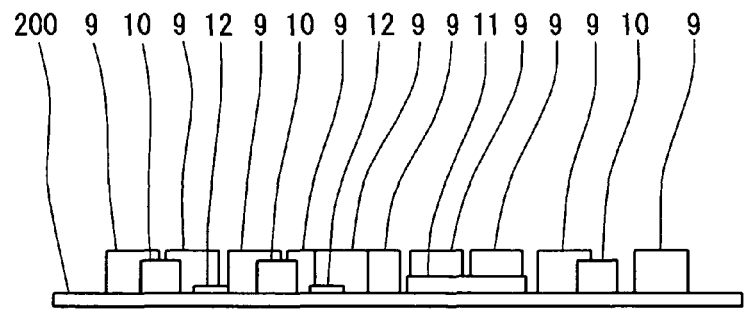
FIG. 8 is a side view of the circuit board of FIG. 7 viewed from a direction indicated by an arrow VIII of FIG. 7.

Referring to FIG. 6, a LCD apparatus 50 according to a second embodiment of the present invention is described. FIG. 6 corresponds to FIG. 1. Whereas the LCD apparatus 1 according to the first embodiment includes one printed circuit board 2, the LCD apparatus 50 includes two printed circuit boards 22, 32.

The printed circuit board 32 has the capacitors 9, 10, the CPU 11, and the electronic elements 12. The capacitors 9, 10 are arranged in lines on a mounting surface 32a of the printed circuit board 32 such that the capacitors 9, 10 approximately overlap each other in each line when viewed from the vertical direction from the top (bottom) to the bottom (top) of FIG. 6.

The printed circuit board 22 has the capacitors 10 and the electronic elements 12. The capacitors 10 are arranged in lines on a mounting surface 22a of the printed circuit board 22 such that the capacitors 10 approximately overlap each other in each line when viewed from the vertical direction.

A shortest distance Z between the printed circuit boards 22, 32 is the distance between the mounting surface 22a of the circuit board 22 and the top surface 9a of the capacitors 9 mounted on the printed circuit board 32. The shortest distance Z is set to 1 mm.

Thus, airflow area is adequately provided so that the amount of airflow along the mounting surfaces 22a, 32a of the printed circuit boards 22, 32 can be adequately increased. The increased airflow effectively cools the circuit elements mounted on the printed circuit boards 22, 32 so that the circuit elements (e.g., the CPU 11) having the relatively low maximum operating temperature can be maintained below the respective maximum operating temperatures.

Setting the shortest distance Z between the printed circuit boards 22, 32 to 1 mm allows the temperature of the CPU 11 to be maintained below 85° C. when the LCD apparatus 50 is used in the vehicle.

Thus, the circuit elements mounted on the printed circuit boards 22, 32 can be maintained below the respective maximum operating temperatures without increasing the thickness D of the LCD apparatus 50.

The capacitors 9, 10 are mounted on the printed circuit boards 22, 32 in such a manner that the capacitors 10 mounted on the printed circuit board 22 directly face the mounting surface 32a of the printed circuit board 32 and the capacitors 9, 10 mounted on the printed circuit board 32 directly face the mounting surface 22a of the printed circuit board 22 when the printed circuit boards 22, 32 are fixed inside the case 3. In other words, the capacitors 9, 10 are mounted on the printed circuit boards 22, 32 in such a manner that the capacitors 9, 10, the CPU 11, and the electronic elements 12 don't overlap each other in the horizontal direction (i.e., left and right direction of FIG. 6) when the printed circuit boards 22, 32 are fixed inside the case 3. In such an approach, the thickness D of the LCD apparatus 50 can be reduced as much as possible.

Projecting lengths of the CPU 11 and the electronic elements 12 from the mounting surfaces 22a, 32a are small as compared to the capacitors 9, 10. Therefore, the electronic elements 12 mounted on the printed circuit board 22 may overlap the CPU 11 or the electronic elements 12 mounted on the printed circuit board 32, as long as the distance between the overlapping elements is maintained below the shortest distance Z.

(Modifications)

The embodiments described above may be modified in various ways. For example, the shortest distance Z between the printed circuit boards 22, 32 may be the distance between the electronic elements 12 and the top surface 9a of the capacitors 9 or a top surface of the capacitors 10. Alternatively, the shortest distance Z between the printed circuit boards 22, 32 may be the distance between the CPU 11 and the top surface of the capacitors 10.

The shortest distances C, Z can be set in a range from 1 mm to 5 mm. When the shortest distances C, Z are set to 5 mm, the temperature increase $\Delta T$ is 15° C. Therefore, margin for the maximum ambient temperature in the vehicle is increased.

The LCD apparatus 1, 50 may have three or more printed circuit boards. In this case, the shortest distances C, Z and a layout of the capacitors 9, 10 are set in the same manner as the first and second embodiments. Thus, the temperatures of the circuit elements mounted on the printed circuit boards 2, 22, 32 can be maintained below the respective maximum operating temperatures without increasing the thickness D of the LCD apparatus 1, 50.

Circuit elements (e.g., coil or transformer) other than the capacitors 9, 10 may have the longest projecting length from the mounting surface.

Various types of liquid crystals can be used for the liquid crystal panel P. For example, twist-nematic liquid crystals may be used instead of the antiferroelectric liquid crystals.

The LCD apparatus 1, 50 may be a passive-matrix type of a LCD apparatus. The LCD apparatus 1, 50 can be used for various applications such as consumer-electronics devices.

Such changes and modifications are to be understood as being within the scope of the present invention as defined by the appended claims.

What is claimed is:

1. A liquid crystal display apparatus comprising:
   a liquid crystal panel:
   a circuit board including a mounting surface and a plurality of circuit elements that are mounted on the mounting surface to constitute a drive circuit for driving the liquid crystal display apparatus; and
   a case for holding the liquid crystal panel and the circuit board,
   the circuit board being positioned approximately in a vertical direction during normal use of the liquid crystal display apparatus,
   the circuit elements including (a) a plurality of first elements, each first element having a first projecting length from the mounting surface, the first projecting length being greater than a projecting length of any other element of the circuit elements, and (b) a plurality of second elements, each second element having a second projecting length from the mounting surface, the second projecting length being smaller than the first projecting length,
   the case having a first vent hole on its top wall and a second vent hole on its bottom wall, the top and bottom walls being located opposite each other in the vertical direction,
   the first elements being arranged on the mounting surface in a first column extending in the vertical direction from the top to the bottom of the case,
   the second elements being arranged on the mounting surface in a second column extending in the vertical direction from the top to the bottom of the case,
   the first column and the second column being located adjacent to each other to define a passage therebetween, and
   the first and second vent holes being configured to introduce air into the passage from outside the case,
   wherein each of the first and second elements is a capacitor,
   wherein the circuit elements further include a third element located in the passage, and
   wherein the third element has a third projection length smaller than each of the first and second projection lengths, the third element further having a maximum operating temperature lower than that of each of the first and second elements, and the third element is a central processing unit (CPU);
   wherein additional second elements are arranged on the mounting surface in the first column, and additional first elements are arranged on the mounting surface in the second column, so that the first column includes first and second elements and the second column includes first and second elements.

2. The liquid crystal display apparatus according to claim 1, further comprising: a light source for illuminating the liquid crystal panel, wherein the drive circuit constituted by the circuit elements includes a panel drive circuit for driving the liquid crystal panel and a light source drive circuit for driving the light source.

3. The liquid crystal display apparatus according to claim 1, wherein a distance between each first element and the case is in the range of from 1 millimeter to 5 millimeters.

4. The liquid crystal display apparatus according to claim 1, wherein
   the circuit board is one of two circuit boards, and
   a distance between each first element mounted on one circuit board and an other circuit board or the case is in the range of from 1 millimeter to 5 millimeters.

5. The liquid crystal display apparatus according to claim 4, wherein
   the mounting surfaces of the two circuit boards face each other, and
   the distance between each first element mounted on one circuit board and the mounting surface of the other circuit board is in the range of from 1 millimeter to 5 millimeters.

6. The liquid crystal display apparatus according to claim 1, wherein the liquid crystal display is mounted to a vehicle.

7. The liquid crystal display apparatus according to claim 1, wherein the case includes a side wall connecting the top wall and bottom wall of the case, the side wall having a third vent hole defined therein.

8. The liquid crystal display apparatus according to claim 1, wherein:
   the case includes a side wall connecting the top wall and bottom wall of the case; and
   the first projecting length projects from the mounting surface toward the side wall such that respective surfaces of the first elements which are located furthest from the mounting surface are 1.0 mm away from the side wall.

9. The liquid crystal display apparatus according to claim 1, wherein:
   the case includes a side wall connecting the top wall and bottom wall of the case; and
   the first, second and third projecting lengths each projects from the mounting surface toward the side wall such that the first elements are closer to the side wall than the second and third elements.

10. The liquid crystal display apparatus according to claim 1, wherein the first and second vent holes are aligned along a straight line in the vertical direction.

11. A liquid crystal display apparatus comprising:
    a liquid crystal panel;
    a circuit board including a mounting surface and a plurality of circuit elements that are mounted on the mounting surface to constitute a drive circuit for driving the liquid crystal display apparatus; and
    a case for holding the liquid crystal panel and the circuit board,
    the circuit board being positioned approximately in a vertical direction during normal use of the liquid crystal display apparatus,
    the circuit elements including (a) a plurality of first elements, each first element having a first projecting length from the mounting surface, the first projecting length being greater than a projecting length of any other element of the circuit elements, and (b) a plurality of second elements, each second element having a second projecting length from the mounting surface, the second projecting length being smaller than the first projecting length, the case having a first vent hole on its top wall and a second vent hole on its bottom wall, the top and bottom walls being located opposite each other in the vertical direction, the first elements being arranged on the mounting surface in a first column extending in the vertical direction from the top to the bottom of the case, the second elements being arranged on the mounting surface in a second column extending in the vertical direction from the top to the bottom of the case, the first column and the second column being located adjacent to each other to define a passage therebetween, and the first and second vent holes being configured to introduce air into the passage from outside the case, wherein each of the first and second elements is a capacitor, wherein the circuit elements further include a third element located in the passage, and wherein the third element has a third projection length smaller than each of the first and second projection lengths, the third element further having a maximum operating temperature lower than that of each of the first and second elements, and the third element is a central processing unit (CPU);

wherein the apparatus further comprises a third column extending in the vertical direction from the top to the bottom of the case, wherein additional first elements are arranged on the mounting surface in the third column.

12. A liquid crystal display apparatus comprising:

a liquid crystal panel;

a first circuit board including a mounting surface and a plurality of circuit elements that are mounted on the mounting surface of the first circuit board, the circuit elements including (a) a plurality of first capacitors, each first capacitor having a first projecting length from the mounting surface of the first circuit board, the first projecting length being greater than a projecting length of any other element of the circuit elements, and (b) a plurality of second capacitors, each second capacitor having a second projecting length from the mounting surface of the first circuit board, the second projecting length being smaller than the first projecting length, a second circuit board including a mounting surface and a plurality of circuit elements that are mounted on the mounting surface of the second circuit board, the circuit elements including a plurality of the third capacitors each third capacitor having a third projecting length from the mounting surface of the second circuit board and toward the mounting surface of the first circuit board, the third projecting length being smaller than the first projecting length, wherein the first and second circuit boards constitute a drive circuit for driving the liquid crystal display apparatus and the plurality of the first and second capacitors project from the mounting surface of the first circuit board and toward the mounting surface of the second circuit board; and a case for holding the liquid crystal panel and the first and second circuit boards, the first and second circuit board being positioned approximately in a vertical direction during normal use of the liquid crystal display apparatus, the case having a first vent hole on its top wall and a second vent hole on its bottom wall, the top and bottom walls being located opposite each other in the vertical direction, the first and second vent holes being configured to introduce air from outside the case, wherein the first, second and third capacitors do not overlap each other in the horizontal direction.

* * * * *